(12) United States Patent
Anderson et al.

(10) Patent No.: US 8,372,679 B2
(45) Date of Patent: Feb. 12, 2013

(54) PROCESS OF FORMING A GRID ELECTRODE ON THE FRONT-SIDE OF A SILICON WAFER

(75) Inventors: David Kent Anderson, Cary, NC (US); Russell David Anderson, Bristol (GB); Kenneth Warren Hang, Hillsborough, NC (US); Shih-Ming Kao, Taoyuan County (TW); Giovanna Laudisio, Bristol (GB); Cheng-Nan Lin, Taoyuan (TW); Chun-Kwei Wu, Taoyuan (TW)

(73) Assignee: E I du Pont de Nemours and Company, Wilmington, DE (US)

( * ) Notice: Subject to any disclaimer, the term of this patent is extended or adjusted under 35 U.S.C. 154(b) by 393 days.

(21) Appl. No.: 12/783,832

(22) Filed: May 20, 2010

(65) Prior Publication Data

US 2010/0294361 A1 Nov. 25, 2010

Related U.S. Application Data

(60) Provisional application No. 61/179,891, filed on May 20, 2009.

(51) Int. Cl.
*H01L 21/00* (2006.01)

(52) U.S. Cl. ............. 438/57; 438/66; 257/E25.009; 136/256

(58) Field of Classification Search ............. 438/57, 438/69, 72, 73; 257/E25.009; 136/256
See application file for complete search history.

(56) References Cited

U.S. PATENT DOCUMENTS

| 5,178,685 A | 1/1993 | Borenstein et al. |
| 5,279,682 A | 1/1994 | Wald et al. |
| 7,462,304 B2 * | 12/2008 | Wang et al. ............. 252/514 |
| 2005/0194037 A1 | 9/2005 | Asai |

FOREIGN PATENT DOCUMENTS

| EP | 2058865 A1 | 5/2009 |
| WO | 89/12321 A1 | 12/1989 |
| WO | 2009/029738 A1 | 3/2009 |
| WO | 2009/059302 A1 | 5/2009 |

OTHER PUBLICATIONS

Curtis et al., "Multi-Layer Inkjet Printed Contacts for Silicon Solar Cells", Photovoltaic Energy Conversion, Conference Record of the 2006 IEEE 4th World Conference on, IEEE, PI, May 1, 2006, pp. 1392-1394.
International Search Report for International Application No. PCT/US2010/035579 Dated Jul. 12, 2010.

* cited by examiner

*Primary Examiner* — Brook Kebede

(57) ABSTRACT

A process of forming a front-grid electrode on a silicon wafer having an ARC layer wherein thin parallel fingers lines that form the front side grid electrode are double printed from a metal paste, and the metal pastes used for the first and second printing differ in their content of glass frit plus optionally present other inorganic additives.

15 Claims, 2 Drawing Sheets

US 8,372,679 B2

PROCESS OF FORMING A GRID ELECTRODE ON THE FRONT-SIDE OF A SILICON WAFER

FIELD OF THE INVENTION

The present invention is directed to a process of forming a grid electrode on the front-side of a silicon wafer.

TECHNICAL BACKGROUND OF THE INVENTION

A conventional solar cell structure with a p-type base has a negative electrode that is typically on the front-side or illuminated side of the cell and a positive electrode on the back-side. It is well known that radiation of an appropriate wavelength falling on a p-n junction of a semiconductor body serves as a source of external energy to generate electron-hole pairs in that body. The potential difference that exists at a p-n junction, causes holes and electrons to move across the junction in opposite directions, thereby giving rise to flow of an electric current that is capable of delivering power to an external circuit. Most solar cells are in the form of a silicon wafer that has been metallized, i.e., provided with metal contacts which are electrically conductive.

Most electric power-generating solar cells currently used are silicon solar cells. Electrodes in particular are made by using a method such as screen printing from metal pastes.

The production of a silicon solar cell typically starts with a p-type silicon substrate in the form of a silicon wafer on which an n-type diffusion layer of the reverse conductivity type is formed by the thermal diffusion of phosphorus (P) or the like. Phosphorus oxychloride ($POCl_3$) is commonly used as the gaseous phosphorus diffusion source, other liquid sources are phosphoric acid and the like. In the absence of any particular modification, the diffusion layer is formed over the entire surface of the silicon substrate. The p-n junction is formed where the concentration of the p-type dopant equals the concentration of the n-type dopant; conventional cells that have the p-n junction close to the illuminated side, have a junction depth between 0.05 and 0.5 µm.

After formation of this diffusion layer excess surface glass is removed from the rest of the surfaces by etching by an acid such as hydrofluoric acid.

Next, an ARC layer (antireflective coating layer) of $TiO_x$, $SiO_x$, $TiO_x/SiO_x$, or, in particular, $SiN_x$ or $Si_3N_4$ is formed on the n-type diffusion layer to a thickness of between 0.05 and 0.1 µm by a process, such as, for example, plasma CVD (chemical vapor deposition).

A conventional solar cell structure with a p-type base typically has a negative grid electrode on the front-side of the cell and a positive electrode on the back-side. The grid electrode is typically applied by screen printing and drying a front-side silver paste (front electrode forming silver paste) on the ARC layer on the front-side of the cell. The front-side grid electrode is typically screen printed in a so-called H pattern which comprises (i) thin parallel finger lines (collector lines) and (ii) two busbars intersecting the finger lines at right angle. In addition, a back-side silver or silver/aluminum paste and an aluminum paste are screen printed (or some other application method) and successively dried on the back-side of the substrate. Normally, the back-side silver or silver/aluminum paste is screen printed onto the silicon wafer's back-side first as two parallel busbars or as rectangles (tabs) ready for soldering interconnection strings (presoldered copper ribbons). The aluminum paste is then printed in the bare areas with a slight overlap over the back-side silver or silver/aluminum. In some cases, the silver or silver/aluminum paste is printed after the aluminum paste has been printed. Firing is then typically carried out in a belt furnace for a period of 1 to 5 minutes with the wafer reaching a peak temperature in the range of 700 to 900° C. The front grid electrode and the back electrodes can be fired sequentially or cofired.

The aluminum paste is generally screen printed and dried on the back-side of the silicon wafer. The wafer is fired at a temperature above the melting point of aluminum to form an aluminum-silicon melt, subsequently, during the cooling phase, an epitaxially grown layer of silicon is formed that is doped with aluminum. This layer is generally called the back surface field (BSF) layer. The aluminum paste is transformed by firing from a dried state to an aluminum back electrode. The back-side silver or silver/aluminum paste is fired at the same time, becoming a silver or silver/aluminum back electrode. During firing, the boundary between the back-side aluminum and the back-side silver or silver/aluminum assumes an alloy state, and is connected electrically as well. The aluminum electrode accounts for most areas of the back electrode, owing in part to the need to form a p+ layer. A silver or silver/aluminum back electrode is formed over portions of the back-side (often as 2 to 6 mm wide busbars) as an electrode for interconnecting solar cells by means of pre-soldered copper ribbon or the like. In addition, the front-side silver paste printed as front-side grid electrode sinters and penetrates through the ARC layer during firing, and is thereby able to electrically contact the n-type layer. This type of process is generally called "firing through".

It has been found that the electrical efficiency of a silicon solar cell can be improved, where the finger lines of the front-side grid electrode are double-printed and where the metal pastes used for the first and the second printing differ in their content of glass frit plus optionally present other inorganic additives. Adhesion between the printed layers is also improved compared to simply printing the same metal paste twice.

In the present description and the claims the term "content of glass frit plus optionally present other inorganic additives" is used. It means the inorganic components of a metal paste without the metal.

SUMMARY OF THE INVENTION

The present invention relates to a process of forming a grid electrode on the front-side of a silicon wafer having a p-type region, an n-type region, a p-n junction and an ARC layer on said front-side, comprising the steps:

(1) printing and drying a metal paste A having fire-through capability on the ARC layer, wherein the metal paste A is printed as thin parallel finger lines forming a bottom set of finger lines, (2) printing and drying a metal paste B over the bottom set of finger lines forming a top set of finger lines superimposing the bottom set of finger lines, (3) printing and drying a metal paste C forming two or more parallel busbars intersecting the finger lines at right angle, and (4) firing the triple-printed silicon wafer, wherein the metal paste A comprises an organic vehicle and an inorganic content comprising (a1) at least one electrically conductive metal powder selected from the group consisting of silver, copper and nickel, and (a2) 0.5 to 8 wt.-% (weight-%), preferably 1 to 3 wt.-% of glass frit, wherein the metal paste B comprises an organic vehicle and an inorganic content comprising (b1) at least one electrically conductive metal powder selected from the group consisting of silver, copper and nickel, and (b2) 0 to 3 wt.-%, preferably 0 to 2 wt.-% of glass frit, wherein the metal paste C comprises an organic vehicle and an inorganic content comprising (c1) at least one electrically conductive metal powder selected from the group consisting of silver, copper and nickel, and (c2) 0.2 to 3 wt.-%, preferably 0.2 to 2 wt.-% of glass frit, wherein the inorganic content of metal paste B as well as that of paste C contains less glass frit plus optionally present other inorganic additives than the inorganic content of metal paste A, and wherein steps (1) to (3) may be performed in any order, provided that step (1) is performed before step (2).

DETAILED DESCRIPTION OF THE INVENTION

Figure 1:
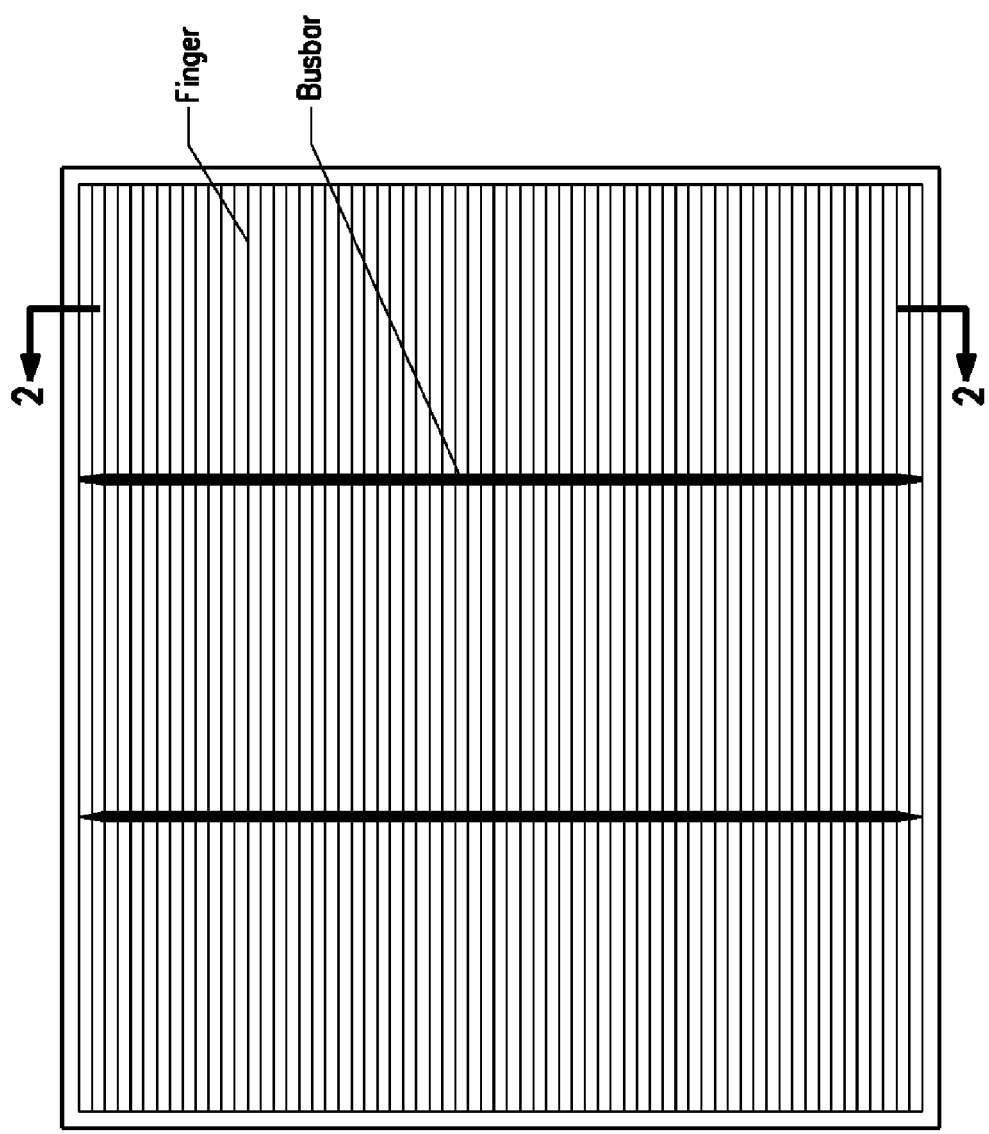
FIG. 1 is a plan view of the front side of a silicon wafer wherein thin parallel finger lines which comprise the front side grid electrode can be seen in relationship to two parallel busbars which intersect the finger lines at a right angle.
Figure 2:
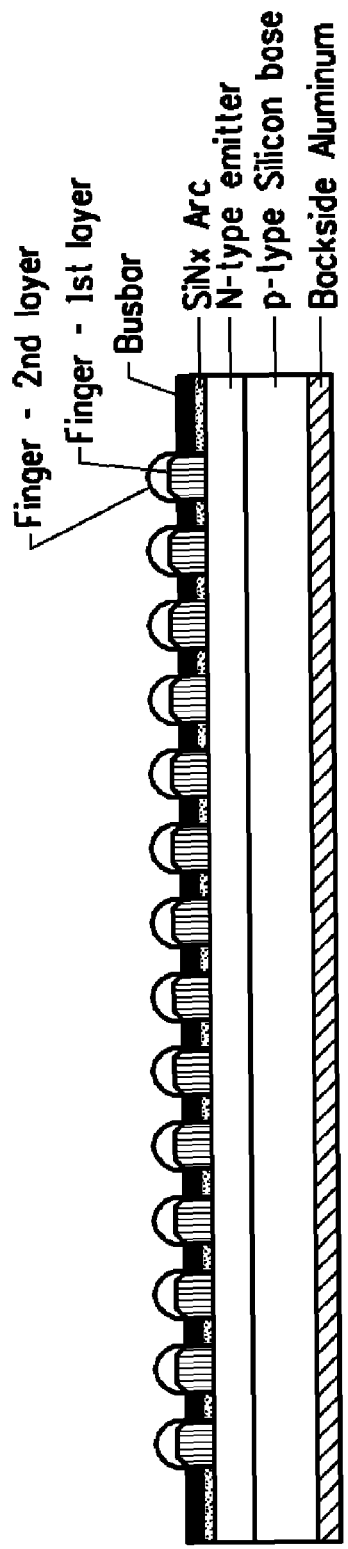
FIG. 2 is a sectional view taken along line 2-2 of FIG. 1 which shows the relationship of Finger—$1^{st}$ layer and Finger—$2^{nd}$ layer which results from double printing the finger lines according to the process of the invention.

In the description and the claims the term "fire-through capability" is used. A metal paste with fire-through capability is one that fires through an ARC layer making electrical contact with the surface of the silicon substrate. Correspondingly, a metal paste with poor or even no fire through capability makes only poor or even no electrical contact with the silicon substrate upon firing.

In step (1) of the process of the present invention a metal paste A with fire-through capability is printed on the ARC layer on the front-side of a silicon wafer. The silicon wafer is a conventional mono- or polycrystalline silicon wafer as is conventionally used for the production of silicon solar cells; it has a p-type region, an n-type region and a p-n junction. The silicon wafer has an ARC layer, for example, of $TiO_x$, $SiO_x$, $TiO_x/SiO_x$, or, in particular, $SiN_x$ or $Si_3N_4$ on its front-side. Such silicon wafers are well known to the skilled person; for brevity reasons reference is made to the section "TECHNICAL BACKGROUND OF THE INVENTION". The silicon wafer may already be provided with the conventional back-side metallizations, i.e. with a back-side aluminum paste and a back-side silver or back-side silver/aluminum paste as described above in the section "TECHNICAL BACKGROUND OF THE INVENTION". Application of the back-side metal pastes may be carried out before or after the front-side grid electrode is finished. The back-side pastes may be individually fired or cofired or even be cofired with the front-side metal pastes printed in steps (1) to (3).

Metal Paste A

Metal paste A is a thick film conductive composition with fire-through capability. It comprises an inorganic content comprising an organic vehicle and an inorganic content comprising (a1a1) at least one electrically conductive metal powder selected from the group consisting of silver, copper and nickel, and (a2) 0.5 to 8 wt.-%, preferably 1 to 3 wt.-% of glass frit.

Metal paste A comprises an organic vehicle. A wide variety of inert viscous materials can be used as organic vehicle. The organic vehicle may be one in which the particulate constituents (electrically conductive metal powder, glass frit) are dispersible with an adequate degree of stability. The properties, in particular, the rheological properties, of the organic vehicle may be such that they lend good application properties to the metal paste, including: stable dispersion of insoluble solids, appropriate viscosity and thixotropy for printing, in particular, for screen printing, appropriate wettability of the ARC layer on the front-side of the silicon wafer and of the paste solids, a good drying rate, and good firing properties. The organic vehicle used in metal paste A may be a nonaqueous inert liquid. The organic vehicle may be an organic solvent or an organic solvent mixture; in an embodiment, the organic vehicle may be a solution of organic polymer(s) in organic solvent(s). Use can be made of any of various organic vehicles, which may or may not contain thickeners, stabilizers and/or other common additives. In an embodiment, the polymer used as constituent of the organic vehicle may be ethyl cellulose. Other examples of polymers which may be used alone or in combination include ethylhydroxyethyl cellulose, wood rosin, phenolic resins and poly(meth)acrylates of lower alcohols. Examples of suitable organic solvents comprise ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after print application of metal paste A can be included in the organic vehicle. Various combinations of these and other solvents may be formulated to obtain the viscosity and volatility requirements desired.

The ratio of organic vehicle in metal paste A to the inorganic content (inorganic components; electrically conductive metal powder plus glass frit plus optionally present other inorganic additives) is dependent on the method of printing metal paste A and the kind of organic vehicle used, and it can vary. Usually, metal paste A will contain 58 to 95 wt.-% of inorganic components and 5 to 42 wt.-% of organic vehicle.

The inorganic content of metal paste A comprises (a1) at least one electrically conductive metal powder selected from the group consisting of silver, copper and nickel, and (a2) 0.5 to 8 wt.-%, preferably 1 to 3 wt.-% of glass frit. The inorganic content may further comprise other inorganic additives, for example, solid oxides or compounds capable of forming solid oxides during firing of metal paste A. In an embodiment, the inorganic content of metal paste A consists of (a1) at least one electrically conductive metal powder selected from the group consisting of silver, copper and nickel, and (a2) 0.5 to 8 wt.-%, preferably 1 to 3 wt.-% of glass frit.

Metal paste A comprises at least one electrically conductive metal powder selected from the group consisting of silver, copper and nickel. Silver powder is preferred. The metal or silver powder may be uncoated or at least partially coated with a surfactant. The surfactant may be selected from, but is not limited to, stearic acid, palmitic acid, lauric acid, oleic acid, capric acid, myristic acid and linolic acid and salts thereof, for example, ammonium, sodium or potassium salts.

The average particle size of the electrically conductive metal powder or, in particular, silver powder is in the range of, for example, 0.5 to 5 μm. The total content of the electrically conductive metal powder or, in particular, silver powder in metal paste A is, for example, 50 to 92 wt.-%, or, in an embodiment, 65 to 84 wt.-%.

In the description and the claims the term "average particle size" is used. It means the mean particle diameter (d50) determined by means of laser scattering. All statements made in the present description and the claims in relation to average particle sizes relate to average particle sizes of the relevant materials as are present in the metal pastes A, B and C.

In general metal paste A comprises only the at least one electrically conductive metal powder selected from the group consisting of silver, copper, and nickel. However, it is possible to replace a small proportion of the electrically conductive metal selected from the group consisting of silver, copper and nickel by one or more other particulate metals. The proportion of such other particulate metal(s) is, for example, 0 to 10 wt. %, based on the total of particulate metals contained in metal paste A.

As already mentioned, metal paste A comprises glass frit as inorganic binder. The average particle size of the glass frit is in the range of, for example, 0.5 to 4 µm.

The preparation of the glass frit is well known and consists, for example, in melting together the constituents of the glass in the form of the oxides of the constituents and pouring such molten composition into water to form the frit. As is well known in the art, heating may be conducted to a peak temperature and for a time such that the melt becomes entirely liquid and homogeneous.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

Metal paste A is a viscous composition, which may be prepared by mechanically mixing the electrically conductive metal powder(s) and the glass frit with the organic vehicle. In an embodiment, the manufacturing method power mixing, a dispersion technique that is equivalent to the traditional roll milling, may be used; roll milling or other mixing technique can also be used.

Metal paste A can be used as such or may be diluted, for example, by the addition of additional organic solvent(s); accordingly, the weight percentage of all the other constituents of metal paste A may be decreased.

In step (1) of the process of the present invention metal paste A is printed, in particular, screen printed as thin parallel finger lines forming a bottom set of finger lines. The parallel finger lines have a distance between each other of, for example, 2 to 5 mm, a dry layer thickness of, for example, 3 to 30 µm and a width of, for example, 25 to 150 µm.

The printed metal paste A is dried, for example, for a period of 1 to 100 minutes with the silicon wafer reaching a peak temperature in the range of 100 to 300° C. Drying can be carried out making use of, for example, belt, rotary or stationary driers, in particular, IR (infrared) belt driers.

In step (2) of the process of the present invention a metal paste B is printed, in particular, screen printed over the bottom set of finger lines forming a top set of finger lines superimposing the bottom set of finger lines.

Metal Paste B

Metal paste B is a thick film conductive composition that may or may not have or may have only poor fire-through capability. Usually it does not have fire-through capability. It comprises an organic vehicle and an inorganic content comprising (b1) at least one electrically conductive metal powder selected from the group consisting of silver, copper and nickel, and (b2) 0 to 3 wt.- %, preferably 0 to 2 wt.- % of glass frit.

It is essential that the inorganic content of metal paste B contains less glass frit plus optionally present other inorganic additives than the inorganic content of metal paste A. In an embodiment, the inorganic content of metal paste B contains less glass frit than the inorganic content of metal paste A. In a most preferred embodiment, metal paste B contains no glass frit and even more preferred also no other inorganic additives.

Metal paste B comprises an organic vehicle. With regard to the organic vehicle the same applies as already mentioned above in connection with the organic vehicle in metal paste A.

Metal paste B comprises at least one electrically conductive metal powder selected from the group consisting of silver, copper and nickel. Silver powder is preferred. The metal or silver powder may be uncoated or at least partially coated with a surfactant. The surfactant may be selected from, but is not limited to, stearic acid, palmitic acid, lauric acid, oleic acid, capric acid, myristic acid and linolic acid and salts thereof, for example, ammonium, sodium or potassium salts.

The average particle size of the electrically conductive metal powder or, in particular, silver powder is in the range of, for example, 0.5 to 5 µm. The total content of the electrically conductive metal powder or, in particular, silver powder in metal paste B is, for example, 50 to 92 wt.- %, or, in an embodiment, 65 to 84 wt.- %.

In general metal paste B comprises only the at least one electrically conductive metal powder selected from the group consisting of silver, copper, and nickel. However, it is possible to replace a small proportion of the electrically conductive metal selected from the group consisting of silver, copper and nickel by one or more other particulate metals. The proportion of such other particulate metal(s) is, for example, 0 to 10 wt. %, based on the total of particulate metals contained in metal paste B.

As already mentioned, metal paste B may comprise glass frit (as inorganic binder). As already mentioned above, it is most preferred that metal paste B is free of glass frit. The average particle size of the glass frit is in the range of, for example, 0.5 to 4 µm.

With regard to the preparation of the glass frit the same applies as already mentioned above in connection with the preparation of the glass frit in metal paste A.

The ratio of organic vehicle in metal paste B to the inorganic content (inorganic components; electrically conductive metal powder plus optionally present glass frit plus optionally present other inorganic additives) is dependent on the method of printing metal paste B and the kind of organic vehicle used, and it can vary. Usually, metal paste B will contain 53 to 95 wt.- % of inorganic components and 5 to 47 wt.- % of organic vehicle.

The inorganic content of metal paste B comprises (b1) at least one electrically conductive metal powder selected from the group consisting of silver, copper and nickel, and (b2) 0 to 3 wt.- %, preferably 0 to 2 wt.-% of glass frit. The inorganic content may further comprise other inorganic additives, for example, solid oxides or compounds capable of forming solid oxides during firing of metal paste B. In an embodiment, the inorganic content of metal paste B consists of (b1) at least one electrically conductive metal powder selected from the group consisting of silver, copper and nickel, and (b2) 0 to 3 wt.- %, preferably 0 to 2 wt.- % of glass frit.

Metal paste B is a viscous composition, which may be prepared by mechanically mixing the electrically conductive metal powder(s) and the optionally present glass frit with the organic vehicle. In an embodiment, the manufacturing method power mixing, a dispersion technique that is equivalent to the traditional roll milling, may be used; roll milling or other mixing technique can also be used.

Metal paste B can be used as such or may be diluted, for example, by the addition of additional organic solvent(s); accordingly, the weight percentage of all the other constituents of metal paste B may be decreased.

In step (2) of the process of the present invention metal paste B is printed, in particular, screen printed over the bottom set of finger lines forming a top set of finger lines superimposing the bottom set of finger lines. The parallel finger lines of the top set of finger lines so formed have a dry layer thickness of, for example, 3 to 30 μm and a width of, for example, 25 to 150 μm. The total dry layer thickness of the finger lines (bottom plus top finger line dry layer thickness) is in the range of, for example, 10 to 50 μm.

The printed metal paste B is dried, for example, for a period of 1 to 100 minutes with the silicon wafer reaching a peak temperature in the range of 100 to 300° C. Drying can be carried out making use of, for example, belt, rotary or stationary driers, in particular, IR belt driers.

In step (3) of the process of the present invention metal paste C is printed, in particular, screen printed as two or more parallel busbars intersecting the finger lines at right angle.

Metal Paste C

Metal paste C is a thick film conductive composition that may or may not have or may have only poor fire-through capability. In a preferred embodiment it does not have fire-through capability. In another preferred embodiment it has only poor fire-through capability. It comprises an organic vehicle and an inorganic content comprising (c1) at least one electrically conductive metal powder selected from the group consisting of silver, copper and nickel, and (c2) 0.2 to 3 wt.-%, preferably 0.2 to 2 wt.-% of glass frit.

It is essential that the inorganic content of metal paste B as well as that of paste C contains less glass frit plus optionally present other inorganic additives than the inorganic content of metal paste A. In an embodiment, the inorganic content of metal paste B as well as that of paste C contains less glass frit than the inorganic content of metal paste A.

Metal paste C comprises an organic vehicle. With regard to the organic vehicle the same applies as already mentioned above in connection with the organic vehicle in metal paste A.

Metal paste C comprises at least one electrically conductive metal powder selected from the group consisting of silver, copper and nickel. Silver powder is preferred. The metal or silver powder may be uncoated or at least partially coated with a surfactant. The surfactant may be selected from, but is not limited to, stearic acid, palmitic acid, lauric acid, oleic acid, capric acid, myristic acid and linolic acid and salts thereof, for example, ammonium, sodium or potassium salts.

The average particle size of the electrically conductive metal powder or, in particular, silver powder is in the range of, for example, 0.5 to 5 μm. The total content of the electrically conductive metal powder or, in particular, silver powder in metal paste C is, for example, 50 to 92 wt.-%, or, in an embodiment, 65 to 84 wt.-%.

In general metal paste C comprises only the at least one electrically conductive metal powder selected from the group consisting of silver, copper, and nickel. However, it is possible to replace a small proportion of the electrically conductive metal selected from the group consisting of silver, copper and nickel by one or more other particulate metals. The proportion of such other particulate metal(s) is, for example, 0 to 10 wt. %, based on the total of particulate metals contained in metal paste C.

As already mentioned, metal paste C comprises glass frit as inorganic binder. The average particle size of the glass frit is in the range of, for example, 0.5 to 4 μm.

In the preferred cases of a metal paste C without or with only poor fire-through capability, the glass frit contained in metal paste C may consist of at least one glass frit selected from the group consisting of (i) lead-containing glass frits with a softening point temperature (glass transition temperature, determined by differential thermal analysis DTA at a heating rate of 10 K/min) in the range of 571 to 636° C. and containing 53 to 57 wt.-% of PbO, 25 to 29 wt.-% of $SiO_2$, 2 to 6 wt.-% of $Al_2O_3$ and 6 to 9 wt.-% of $B_2O_3$, (ii) lead-free glass frits with a softening point temperature in the range of 550 to 611° C. and containing 11 to 33 wt.-% of $SiO_2$, >0 to 7 wt.-%, in particular 5 to 6 wt.-% of $Al_2O_3$ and 2 to 10 wt.-% of $B_2O_3$, and (iii) lead-free glass frits with a softening point temperature in the range of 550 to 611° C. and containing 40 to 73 wt.-% of $Bi_2O_3$, 11 to 33 wt.-% of $SiO_2$, >0 to 7 wt.-%, in particular 5 to 6 wt.-% of $Al_2O_3$ and 2 to 10 wt.-% of $B_2O_3$. In other words, here, the at least one glass frit may comprise glass frit of type (i) and/or of type (ii) and/or of type (iii); the ratio between the different glass frit types may be any. In case of the lead-free glass frit of type (ii), the weight percentages of $SiO_2$, $Al_2O_3$ and $B_2O_3$ do not total 100 wt.-% and the missing wt.-% are in particular contributed by one or more other oxides, for example, alkali metal oxides like $Na_2O$, alkaline earth metal oxides like MgO and metal oxides like $Bi_2O_3$, $TiO_2$ and ZnO. In case of the lead-free glass frit of type (iii) which represents a particular embodiment of the lead-free glass frit of type (ii), the weight percentages of $Bi_2O_3$, $SiO_2$, $Al_2O_3$ and $B_2O_3$ may or may not total 100 wt.-%; in case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

With regard to the preparation of the glass frits the same applies as already mentioned above in connection with the preparation of the glass frits in metal paste A.

The ratio of organic vehicle in metal paste C to the inorganic content (inorganic components; electrically conductive metal powder plus glass frit plus optionally present other inorganic additives) is dependent on the method of printing metal paste C and the kind of organic vehicle used, and it can vary. Usually, metal paste C will contain 53 to 95 wt.-% of inorganic components and 5 to 47 wt.-% of organic vehicle.

The inorganic content of metal paste C comprises (c1) at least one electrically conductive metal powder selected from the group consisting of silver, copper and nickel, and (c2) 0.2 to 3 wt.-%, preferably 0.2 to 2 wt.-% of glass frit. The inorganic content may further comprise other inorganic additives, for example, solid oxides or compounds capable of forming solid oxides during firing of metal paste C. In an embodiment, the inorganic content of metal paste C consists of (c1) at least one electrically conductive metal powder selected from the group consisting of silver, copper and nickel, and (c2) 0.2 to 3 wt.-%, preferably 0.2 to 2 wt.-% of glass frit.

Metal paste C is a viscous composition, which may be prepared by mechanically mixing the electrically conductive metal powder(s) and the glass frit with the organic vehicle. In an embodiment, the manufacturing method power mixing, a dispersion technique that is equivalent to the traditional roll milling, may be used; roll milling or other mixing technique can also be used.

Metal paste C can be used as such or may be diluted, for example, by the addition of additional organic solvent(s); accordingly, the weight percentage of all the other constituents of metal paste C may be decreased.

In step (3) of the process of the present invention metal paste C is printed, in particular, screen printed as two or more parallel busbars intersecting the finger lines at right angle. The busbars have a dry layer thickness of, for example, 10 to 50 μm and a width of, for example, 1 to 3 mm.

The printed metal paste C is dried, for example, for a period of 1 to 100 minutes with the silicon wafer reaching a peak temperature in the range of 100 to 300° C. Drying can be carried out making use of, for example, belt, rotary or stationary driers, in particular, IR belt driers.

The steps (1) to (3) of the process of the present invention may be performed in any order, provided that step (1) is performed before step (2). In other words, the following sequences of process steps (1) to (3) are possible: (1)-(2)-(3), (1)-(3)-(2) and (3)-(1)-(2).

Firing Step

The firing step (4) following steps (1) to (3) is a cofiring step. It is however also possible, although not preferred, to perform one or two additional firing steps between steps (1) to (3).

The firing of step (4) may be performed, for example, for a period of 1 to 5 minutes with the silicon wafer reaching a peak temperature in the range of 700 to 900° C. The firing can be carried out making use of, for example, single or multi-zone belt furnaces, in particular, multi-zone IR belt furnaces. The firing may happen in an inert gas atmosphere or in the presence of oxygen, for example, in the presence of air. During firing the organic substance including non-volatile organic material and the organic portion not evaporated during the drying may be removed, i.e. burned and/or carbonized, in particular, burned and the glass frit sinters with the electrically conductive metal powder. Metal paste A etches the ARC layer and fires through making electrical contact with the silicon substrate. If metal paste C has fire-through capability, the busbars etch the ARC layer and fire through making electrical contact with the silicon substrate. In the preferred cases of metal paste C having no or only poor fire-through capability the busbars remain as "non-contact" busbars (floating busbars, busbars which have not or only to a limited extent fired through the ARC layer) after firing, i.e. the ARC layer survives at least essentially between the busbars and the silicon substrate.

It is an additional advantage of the process of the present invention that the grid electrodes made thereby are distinguished by outstanding solder adhesion.

EXAMPLES (1) Manufacture of Solar Cell

A solar cell was formed as follows:

(i) On the front face of a Si substrate (200 μm thick multicrystalline silicon wafer of area 243 cm$^2$, p-type (boron) bulk silicon, with an n-type diffused POCl$_3$ emitter, surface texturized with acid, SiN$_x$ ARC layer on the wafer's emitter applied by CVD) having a 30 μm full plane thick aluminum electrode (screen-printed from PV381 Al composition commercially available from E. I. Du Pont de Nemours and Company), a front-side silver paste (PV159 commercially available from E. I. Du Pont de Nemours and Company; inorganic content without metal: 7 wt.-%, glass frit content: 2 wt.-%) was screen-printed and dried as 107 μm wide and parallel finger lines having a distance of 2.25 mm between each other. Then a silver paste B was screen printed and dried as two 2 mm wide and 13 μm thick parallel busbars intersecting the finger lines at right angle. Then a silver paste C was screen printed and dried as 107 μm wide and parallel finger lines having a distance of 2.25 mm between each other superimposing the bottom set of finger lines. All metal pastes were dried before cofiring. Total thickness of the fingers after firing was 27 μm.

The silver paste B comprised 81 wt.-% silver powder (average particle size 2 μm) and 19 wt.-% organic vehicle (organic polymeric resins and organic solvents) plus glass frit (average particle size 0.8 μm). The glass frit content of silver paste B was 2.0 wt.-%.

The silver paste C comprised 85 wt.-% silver powder (average particle size 2 μm) and 15 wt.-% organic vehicle (organic polymeric resins and organic solvents) plus glass frit (average particle size 0.8 μm). The glass frit content of silver paste C was 0.5 wt.-%.

Table 1 provides composition data of the glass frit types that have been used.

(ii) The printed wafers were then fired in a Despatch furnace at a belt speed of 3000 mm/min with zone temperatures defined as zone 1=500° C., zone 2=525° C., zone 3=550° C., zone 4=600° C., zone 5=925° C. and the final zone set at 900° C. After firing, the metallized wafers became functional photovoltaic devices.

Measurement of the electrical performance was undertaken. Furthermore the laydown was measured.

(2) Test Procedures

Efficiency

The solar cells formed according to the method described above were placed in a commercial I-V tester (supplied by h.a.l.m. elektronik GmbH) for the purpose of measuring light conversion efficiencies. The lamp in the I-V tester simulated sunlight of a known intensity (approximately 1000 W/m$^2$) and illuminated the emitter of the cell. The metallizations printed onto the fired cells were subsequently contacted by four electrical probes. The photocurrent (Voc, open circuit voltage; Isc, short circuit current) generated by the solar cells was measured over a range of resistances to calculate the I-V response curve.

Table 2 provides an overview about example 1 (according to the invention) and comparative example 2.

TABLE 1

| Glass type | Glass composition in wt. %: | | | | | | |
|---|---|---|---|---|---|---|---|
| | SiO$_2$ | Al$_2$O$_3$ | B$_2$O$_3$ | PbO | Bi$_2$O$_3$ | TiO$_2$ | PbF$_2$ |
| Glass in paste A | 22 | 0.4 | 7.5 | 46.8 | 6.8 | 5.8 | 10.7 |
| Glass in pastes B and C | 28 | 4.7 | 8.1 | 55.9 | | 3.3 | |

TABLE 2

| Ex. | 1$^{st}$ layer | 2$^{nd}$/3$^{rd}$ layers | Total laydown (mg) | Voc (mV) | Isc (A) | Efficiency (%) | FF (%) | Grid resistance (mΩ) |
|---|---|---|---|---|---|---|---|---|
| 1 | PV159 | B/C | 289 | 607.8 | 8.14 | 15.80 | 77.2 | 19.6 |
| 2 | PV159 | PV159/ PV159 | 438 | 612.7 | 8.15 | 15.13 | 73.8 | 21.9 |

What is claimed is:

1. A process of forming a grid electrode on the front-side of a silicon wafer having a p-type region, an n-type region, a p-n junction and an ARC layer on said front-side, comprising the steps:
   (1) printing and drying a metal paste A having fire-through capability on the ARC layer, wherein the metal paste A is printed as thin parallel finger lines forming a bottom set of finger lines;
   (2) printing and drying a metal paste B over the bottom set of finger lines forming a top set of finger lines superimposing the bottom set of finger lines;
   (3) printing and drying a metal paste C forming two or more parallel busbars intersecting the finger lines at right angle; and
   (4) firing the silicon wafer;
   wherein the metal paste A comprises an organic vehicle and an inorganic content comprising (a1) at least one electrically conductive metal powder selected from the group consisting of silver, copper and nickel, and (a2) 0.5 to 8 wt. % of glass frit,
   wherein the metal paste B comprises an organic vehicle and an inorganic content comprising (b1) at least one electrically conductive metal powder selected from the group consisting of silver, copper and nickel, and (b2) 0 to 3 wt. % of glass frit,
   wherein the metal paste C comprises an organic vehicle and an inorganic content comprising (c1) at least one electrically conductive metal powder selected from the group consisting of silver, copper and nickel, and (c2) 0.2 to 3 wt. % of glass frit,
   wherein the inorganic content of said metal paste B as well as that of said paste C contains less glass frit plus optionally present other inorganic additives than the inorganic content of said metal paste A, and
   wherein steps (1) to (3) are performed in any order, provided that said step (1) is performed before said step (2).

2. The process of claim 1, wherein the total content of the electrically conductive metal powder in said metal paste A is 50 to 92 wt. %.

3. The process of claim 1, wherein the total content of the electrically conductive metal powder in said metal paste B is 50 to 92 wt. %.

4. The process of claim 1, wherein the total content of the electrically conductive metal powder in said metal paste C is 50 to 92 wt. %.

5. The process of claim 1, wherein the at least one electrically conductive metal powder in said metal paste A is silver powder.

6. The process of claim 1, wherein the at least one electrically conductive metal powder in said metal paste B is silver powder.

7. The process of claim 1, wherein the at least one electrically conductive metal powder in said metal paste C is silver powder.

8. The process of claim 1, wherein said metal paste B contains no glass frit.

9. The process of claim 8, wherein said metal paste B contains no other inorganic additives.

10. The process of claim 1, wherein said metal paste C has no fire-through capability.

11. The process of claim 10, wherein the glass frit contained in said metal paste C consists of at least one glass frit selected from the group consisting of (i) lead-containing glass frits with a softening point temperature in the range of 571 to 636° C. and containing 53 to 57 wt. % of PbO, 25 to 29 wt. % of $SiO_2$, 2 to 6 wt. % of $Al_2O_3$ and 6 to 9 wt. % of $B_2O_3$, (ii) lead-free glass frits with a softening point temperature in the range of 550 to 611° C. and containing 11 to 33 wt. % of $SiO_2$, >0 to 7 wt. % of $Al_2O_3$ and 2 to 10 wt. % of $B_2O_3$, and (iii) lead-free glass frits with a softening point temperature in the range of 550 to 611° C. and containing 40 to 73 wt. % of $Bi_2O_3$, 11 to 33 wt. % of $SiO_2$, >0 to 7 wt. % of $Al_2O_3$ and 2 to 10 wt % of $B_2O_3$.

12. The process of claim 1, wherein the ARC layer is selected from the group consisting of $TiO_x$, $SiO_x$, $TiO_x/SiO_x$, $SiN_x$ or $Si_3N_4$ ARC layers.

13. The process of claim 1, wherein the printing in steps (1) to (3) is screen printing.

14. A front-side grid electrode produced according to the process of claim 1.

15. A silicon solar cell comprising a silicon wafer having an ARC layer on its front-side and the front-side grid electrode of claim 14.

* * * * *